United States Patent [19]

Itoh et al.

[11] Patent Number: 4,537,814

[45] Date of Patent: Aug. 27, 1985

[54] RESIN ARTICLE HAVING A CERAMICS COATING LAYER

[75] Inventors: Toshiyasu Itoh, Kasugai; Takaaki Mori, Handa, both of Japan

[73] Assignee: Toyoda Gosei Co., Ltd., Nishikasugai, Japan

[21] Appl. No.: 574,256

[22] Filed: Jan. 26, 1984

[30] Foreign Application Priority Data

Jan. 27, 1983 [JP] Japan ................................ 58-11852

[51] Int. Cl.³ .................... B32B 27/08; B32B 27/30
[52] U.S. Cl. ................................ 428/217; 427/419.6; 428/412; 428/441; 428/519; 428/520; 428/521; 428/522
[58] Field of Search ............... 428/412, 217, 426, 429, 428/441, 519, 520, 521, 522, 195; 427/419.6, 419.2

[56] References Cited

U.S. PATENT DOCUMENTS 4,341,841  7/1982  Ohno et al. ......................... 428/412

FOREIGN PATENT DOCUMENTS 54-139979 10/1979 Japan ................................. 428/412

*Primary Examiner*—Paul J. Thibodeau
*Attorney, Agent, or Firm*—Cushman, Darby & Cushman

[57] ABSTRACT

A resin article having a ceramics coating layer comprises a resin substrate, an intermediate layer and a ceramics coating layer. The intermediate layer is made of a crosslinked resin having a higher hardness than that of the resin substrate. The intermediate layer acts to increase the bonding strength between the resin substrate and the coating layer so that the durability against the peeling of the coating layer can be improved.

5 Claims, No Drawings

RESIN ARTICLE HAVING A CERAMICS COATING LAYER

BACKGROUND OF THE INVENTION

1. Field of the Invention

The present invention relates to a resin article having a coating layer made of ceramics.

2. Description of the Prior Art

Conventionally, resin articles produced by injection molding or extrusion molding have been coated with a ceramics layer by such physical deposition methods as vacuum evaporation and sputtering.

However, the conventional resin articles having the coating layer have the following disadvantage. The adhesion between the ceramics coating layer and the resin substrate is not sufficient so that the ceramics coating layer tends to peel off the surface of the resin substrate.

SUMMARY OF THE INVENTION

Therefore, the primary object of the present invention is to provide a resin article having a ceramics coating layer which can eliminate the easy peeling.

DETAILED DESCRIPTION OF THE INVENTION

The resin article having the ceramics coating layer according to the present invention comprises a resin substrate shaped in a form such as a plate, a ceramics coating layer formed by a physical coating method, and an intermediate layer between the substrate and coating layer. The intermediate layer is made of a resin which has a higher hardness than that of the resin forming the substrate.

The resin substrate in this description designates a molded body made of a thermoplastic resin or a thermosetting resin. The resin article may be formed in a regular shape such as a plate which can be determined according to the usage. Such resins as polymethyl acrylate, ABS, polyvinylchloride, nylon and polyester may be employed.

The ceramics coating layer is a thin ceramics which is formed by a conventional physical vapor deposition. Such physical deposition methods are available as vacuum evaporation, sputtering, reactive vacuum evaporation and reactive sputtering. The ceramics coating layer may be such a conductive transparent one as indium tin oxide composed of indium oxide including tin oxide for 5%. Also such ceramics coating layer may be made of titanium nitride, aluminium nitride, silicon oxide and titanium oxide.

The intermediate layer is made of the resin preferably having a higher hardness than that of the substrate by at least 1 or 2 pencil hardness (the hardness degree of the pencil lead such as H and B). The intermediate layer is preferred to be formed of the cured resin having cross-linking, especially the cured resin of micromolecule having a three dimensional network structure.

Such resins are employed as a crosslinking acrylic resin and a crosslinking organosiloxane resin. The resin material to form the intermediate layer is applied on the surface of the substrate by a conventional method such as painting. Then, the coating layer is cured by drying or heating if necessary, to result in an intermediate layer. The intermediate layer is preferred to be 0.5–50 micrometers thick.

On this intermediate layer, is applied the ceramics coating layer by such conventional physical deposition method as vacuum evaporation.

The resin article of the present invention is composed of the ceramics coating layer, the resin substrate and the intermediate layer therebetween. The intermediate layer has a higher hardness than that of the resin substrate. Such an intermediate layer is provided in order to increase the each bonding strength between the intermediate layer and the resin substrate or the ceramics coating layer. Thus the ceramics coating layer does not easily peel off the resin substrate.

A transparent intermediate layer is formed on a transparent resin substrate, thereon is formed a ceramics coating layer made of indium tin oxide. Thus a transparent electrode panel is produced, which can be employed for a liquid crystal or an electroluminescence.

The embodiment will be described in the following.

EMBODIMENT 1

In this embodiment, a transparent plastics plate ($100 \times 100 \times 3$ mm) was employed as a resin substrate, which was made of polymethylmethacrylate. This resin substrate was cleaned with neutral detergent, ultrasonic cleaner then with hot water, and thereafter dried sufficiently.

One side surface of this resin substrate was painted with an acrylate painting with an acrylate monomers having multifunctional groups. Then the ultraviolet light was irradiated so as to harden the acrylate. Thus the intermediate layer was formed. This intermediate layer was 10 micrometers thick, and the surface thereof was about 6H pencil hardness. The surface of the resin substrate was about 4H pencil hardness.

The resin substrate was installed in a holder of an ordinary sputtering device then sputtered. A ceramics made of indium oxide ($In_2O_3$) and tin oxide ($SnO_2$) (91 mol%–9 mol%) was employed as a target. The distance between the target and the substrate was 8 cm. After exhausting the air within the vacuum chamber until $1 \times 10^{-5}$ torr, argon gas was intaken through a leak valve to be $1 \times 10^{-3}$ torr. Sputtering was continued for 4 minutes rotating the holder, with the discharge of 500 W. As described above, ceramics coating layer of indium tin oxide was formed. Such a ceramics coating layer is approximately 600 Å thick, having a light transmittance of 82% and a surface resistivity of 100 $\Omega/cm^2$.

The durability against peeling of such a ceramics coating layer is tested by using a tape. This taping test is utilized as follows. On the surface of the ceramics coating layer, one hundred squares of $1 \times 1$ mm are formed by cutting in longitudinal and vertical lines at 1 mm spaces. Thereon, a cellulose acetate (cellophane) adhesive tape of 26 mm wide is placed and abruptly pulled of by one end of the tape up in the vertical direction. Whether the coating layer comes off or not is observed.

It was proved by such test using a tape, that no ceramics coating layer came off the resin article according to the present embodiment.

For comparison, a coating layer of indium tin oxide was sputtered directly to the surface of acrylic resin plate without an intermediate layer. Such a resin article having a ceramics coating layer did not differ from that of the first embodiment, about its external appearance, transparency and surface resistivity. However, its taping test resulted in the peeling of all one hundred squares.

EMBODIMENT 2

A polycarbonate plate (100×150×4 mm) was employed as a resin substrate. The resin substrate was cleaned similarly as the first embodiment. Then organosiloxane paint including monomers with multifunctional groups was painted and heated to be hardened. Thus an intermediate coating layer made of silicon resin was formed. It was 1 micrometer thick and the surface of the polycarbonate substrate was B pencil hardness.

Next, a coating layer of indium tin oxide was formed with a similar sputtering device as that of the first embodiment. The material made of indium and tin (In:90 wt%–Sn:10 wt%) was employed as a target. After exhausting the air within the vacuum chamber until $1\times10^{-5}$ torr, oxygen gas was intaken through a leak valve to be $2\times10^{-4}$ torr. Then argon gas was intaken to be $1\times10^{-3}$ torr in the vacuum chamber. In this state, the coating layer of indium tin oxide was formed by reactive sputtering for two minutes with the discharge of 400 W. The resulted ceramics coating layer was about 300 Å thick, having a light transmittance of 80% and a surface resistivity of 100 $\Omega/cm^2$.

The similar taping test was made and it was proved that no peeling of the ceramics coating layer occured.

For comparison, a ceramic coating layer was sputtered directly to the surface of the same substrate without an intermediate layer. Such a resin article having a ceramics coating layer did not differ from that of the second embodiment, about its external appearance, transparency and surface resistivity. However, its taping test resulted in the peeling of thirty squares in one hundred.

EMBODIMENT 3

A resin plate (100×80×3 mm) was employed as a resin substrate, which was made of ABS. This substrate was cleaned likewise, then multifunctional organosiloxane was painted and hardened by heating. Thus an intermediate layer of silicon resin was formed. It was 5 micrometer thick and the surface thereof was 3H pencil hardness. The surface of the ABS substrate was F pencil hardness.

Next, metallic titanium was used as a target and reactive suttering was made with a similar sputtering machine as that of the first embodiment. For this reactive sputtering, the air within the vacuum chamber was exhausted to be $1\times10^{-5}$ torr. Then nitrogen gas ($N_2$) was intaken through a leak valve to be $3\times10^{-4}$ torr and next argon gas, resulting in $2\times10^{-3}$ torr within the vacuum chamber. In this state, reactive sputtering was continued for two minutes with the discharge of 500 W. Thus a coating layer made of titanium nitride was formed, which was approximately 500 Å in thickness and colored gold. Its surface appeared smooth without cracks. The aforesaid taping test was made similarly, and resulted in no peeling off.

For comparison, a ceramics coating layer was formed directly on the surface of an ABS substrate without an intermediate layer, by reactive sputtering similarly as described above. Cracks were obserbed on such ceramics coating layer. A taping test resulted in the peeling of twenty squares in one hundred.

EMBODIMENT 4

A resin plate (100×100×3 mm) was employed as a resin substrate, which was made of polymetylmethacrylate. Multifunctional organosiloxane paint was painted and hardened by heating to form a coating layer of silicon. This intermediate layer was 2 micrometer thick and the surface thereof was 6H pencil hardness. The surface of the resin substrate of poly methyl methacrylate was 4H pencil hardness.

Then a coating layer of titanium oxide was formed by reactive sputtering. Metallic titanium was employed as a target and reactive sputtering with oxide was carried out. For the sputtering, the air within the vacuum chamber was exhausted to be $1\times10^{-5}$ torr, oxigen gas was intaken to be $5\times10^{-4}$ torr, then argon gas until $1\times10^{-3}$ torr within the vacuum chamber. In this state, sputtering was continued for five minutes with the discharge of 350 W. Thus a ceramics coating layer was produced, which was approximately 450 Å. Its light transmittance was 85% and its infrared reflection characteristics was good. The similar taping test resulted in no peeling off.

For comparison, a ceramics coating layer of titanium oxide was formed directly to the surface of a polymethylmethacrylate plate without an intermediate layer, by reactive sputtering similarly as described above. Such ceramics coating layer did not deffer from that of the fourth embodiment, about its external apperarnce or transparency. However, the taping test resulted in the peeling of eighty squares in one hundred.

EMBODIMENT 5

A resin plate (100×80×4 mm) was employed as a resin substrate, which was made of polycarbonate. After this resin substrate was cleaned similarly as the first embodiment, multifunctional acrylate was painted on the substrate and hardened by irradiating ultraviolet light. Thus an intermediate layer was formed, which was 40 micrometer thick and the surface thereof was 2H pencil hardness. The surface of the resin substrate of polycarbonate was B pencil hardness.

Next, a coating layer of aluminium nitride was formed by reactive sputtering. The similar sputtering machine was used as that of the first embodiment. For this reactive sputtering, the air within a vacuum chamber was exhausted to be $1\times10^{-5}$ torr, then nitrogen gas was intaken through a reak valve reaching to $8\times10^{-4}$ torr. In this state, reactive sputtering was continued for 4 minutes with the discharge of DC 400 V, 1.5 A. Thus a coating layer of aluminium nitride was formed, which was approximately 300 Å and its visual light transmittance was 80%. The taping test resulted in no peeling of the ceramic layer.

For comparison, a coating layer of aluminium nitride was formed directly on the surface of a polycarbonate substrate without an intermediate layer, by reactive sputtering similarly as described above. Such ceramics coating layer did not differ from that of the fifth embodiment, however, the taping test resulted in the peeling of fourty squares in one hundred.

What is claimed is:

1. A resin article having a ceramics coating layer thereon, said article comprising:
   a resin substrate formed in an uniform shape,
   an intermediate layer made of a cross-linked acrylate having a hardness greater than said resin substrate at least partially covering the surface of said resin substrate, and
   a ceramics coating layer formed on the surface of said intermediate layer.

2. The resin article according to claim 1, in which the intermediate layer is harder than said resin by at least 1 pencil hardness.

3. The resin article according to claim 1, in which the resin substrate is made of a thermoplastic resin or a thermosetting resin.

4. The resin article according to claim 3, in which the thermoplastic resin is a polycarbonate, polymethylmethacrylate, or ABS.

5. The resin article according to claim 1 in which the ceramic coating layer is indium tin oxide.

* * * * *